United States Patent [19]

Choi

[11] Patent Number: 5,597,408
[45] Date of Patent: Jan. 28, 1997

[54] ANTI-REFLECTIVE COATING COMPOSITION

[75] Inventor: Young-joon Choi, Seoul, Rep. of Korea

[73] Assignee: Samsung Electronics Co., Ltd., Suwon, Rep. of Korea

[21] Appl. No.: 564,959

[22] Filed: Nov. 30, 1995

[30] Foreign Application Priority Data

Nov. 30, 1994 [KR] Rep. of Korea ................ 94-32130

[51] Int. Cl.$^6$ ................. C09D 5/32; C09D 101/02; C09D 105/00; C09D 201/06
[52] U.S. Cl. ................ 106/481; 106/217.3; 524/89; 524/110; 524/188
[58] Field of Search ................... 106/204, 217, 106/481; 524/89, 110, 188

[56] References Cited

U.S. PATENT DOCUMENTS

| | | | |
|---|---|---|---|
| 4,251,282 | 2/1981 | Vahlensieck et al. | 106/481 |
| 4,613,667 | 9/1986 | Marraccini et al. | 106/481 |
| 5,482,547 | 9/1996 | Bugnon et al. | 106/204 |

*Primary Examiner*—David Brunsman
*Attorney, Agent, or Firm*—Cushman Darby & Cushman, IP Group of Pillsbury Madison & Sutro LLP

[57] ABSTRACT

A composition having 1.0–50.0 wt % of a compound having both a structure of organosilane, organosilazane, or organosiloxazane and a structure of a dye compound which has light-absorbing capabilities in a particular wavelength band, 50.0–99.0 wt % of solvent, and optionally 0"10 wt % of a water-soluble polymer, improves adhesion to a photoresist film and anti-reflection characteristics in exposure.

7 Claims, No Drawings

ANTI-REFLECTIVE COATING COMPOSITION

BACKGROUND OF THE INVENTION

The present invention relates to an anti-reflective coating composition, and more particularly, to an anti-reflective coating composition having adhesive properties with respect to a photoresist film and a substrate.

A main component of a photoresist is a photosensitive polymer which is solubilized or insolubilized by irradiation. The photosensitive polymer is a hydrophobic organic material and, accordingly, exhibits poor adhesion to a hydrophilic material. Coating photoresist on a relatively hydrophilic substrate often leads to poor adhesion. Therefore, poor photoresist adhesion leads to undercutting, reduced resolution or, in extreme cases, total pattern destruction. Furthermore, poor adhesion increases the possibility of the photoresist lifting off from the substrate during subsequent processing (e.g., etching), whereby the developed image is incorrect.

A method for enhancing the adhesion of a photoresist to a substrate, wherein a surface of a substrate has been treated with an organo-silane compound having a bulky hydrocarbon group, has been proposed. The most representative method for enhancing adhesion of a photoresist is to use hexamethyldisilazane (HMDS) which is an organo-silicon compound, as an adhesion promoter. The HMDS causes bonding of silicon atoms and oxygen atoms in the substrate, thereby changing the surface from hydrophilic to hydrophobic.

Meanwhile, uneven topology is a serious problem in photolithography processes, since it causes diffused reflection leading to photoresist notching. To prevent the notching of a photoresist, there is a method wherein reflected light is absorbed by using a material having light absorbing properties at a wavelength region of a light source used in the photolithography processing. That is, a compound absorbing 436 nm (g-line) or 365 nm (i-line) light absorbs the reflected light, which prevents light-induced change of a photo-active compound in the photoresist.

Ways for using such light absorbing material includes the following two methods: one method wherein a dye is added directly to a photoresist or another method wherein a dye or a particular wavelength absorbing compound is coated on a photoresist or a substrate. The particular photoresist added with dyes has an enough high light absorption coefficient to absorb reflected light. Accordingly a photo-active compound in a non-exposure portion is protected so that it does not react to reflected light. However, the method of adding dyes does require increased light exposure. Therefore, the recent trend is to use an anti-reflective coating for preventing photoresist notching. Widely used as the anti-reflective coating is a water-soluble material including a chemical material for a dyestuff which can maximally absorb light at a particular wavelength region. Meanwhile, according to the above dye coating method, a thin anti-reflective coating of about 50 nm can be obtained by coating and dying dyestuff material a substrate or photoresist.

Further, to improve adhesion of the photoresist and present the phenomenon of notching, due to diffused reflection, an adhesion promoter such as HMDS and a light absorbent, such as dye had to be used, which led to increased manufacturing cost of semiconductor devices.

SUMMARY OF THE INVENTION

Therefore, it is an object of the present invention to provide a single compound and a composition including the single compound, which can prevent the notching phenomenon due to diffused reflection while enhancing photoresist adhesion.

To accomplish the above object of the present invention, there is provided an anti-reflective coating composition comprising 1.0–50.0 wt % of a dyed organosilicon compound which has both a structure of an organo-silicon compound and a structure of a dye compound having light-absorbing capabilities at a particular wavelength region, 50.0–99.0 wt % of solvent. The anti-reflective coating composition may further comprise 0.01–10 wt % of water-soluble high-molecules.

The structure of the organo-silicon compound is derived from one compound selected from the group consisting of organosilane, organosilazane and organosiloxazane having chemical formulas of $R_4Si$, $R_3SiNH_2$ and $(H_2NSiR_2)_2O$, respectively, where R indicates a hydrogen, alkyl, aryl, or alkoxy group.

Preferably, the organosilane structure is derived from trialkyl[p-1-(2-dialkylaminoalkoxycarbonyl-2-hydroxyalkyl)phenyl]silane or [4,6-diphenyl-1,3,5-triasinyl-2-aminoalkyl]trialkylsilane, the organosilazane structure is derived from dialkyl[p-(2-morpholinocarbonylalkyl) phenyl]silazane, and the organosiloxazane structure is derived from alkylsiloxazane or arylsiloxazane.

It is further preferable that the structure of a dye compound having light-absorbing capabilities at a particular wavelength region is derived from one selected from the group consisting of 1,1'-bianthracenylpolyene, 4-(β,β-dicyanovinyl)-3-alkyl-N,N-dialkylaniline, 4-tricyanovinyl-3-halo-N,N-dialkylaniline, alkylphenylazothioformic acid, coumarin derivatives and thioacridone derivatives.

It is preferable that the wavelength in which a dye compound maximally absorbs light is 300–500 nm.

Furthermore, it is preferable that the solvent is one selected from the group consisting of alcohol, glycol ether, aromatic hydrocarbon, ketone, ester and a mixture thereof.

It is preferable that the water-soluble polymer is one selected from the group consisting of cellulose, polysaccharide, and polyalcohol.

According to the present invention, there is also provided a composition having both a structure of organosilicon which has adhesion to a substrate and a photoresist, and a structure of a dye compound of which light absorption coefficient at a particular wavelength band is high. Thus, the composition not only improves adhesion of the photoresist but also prevents photoresist notching.

DETAILED DESCRIPTION OF THE INVENTION

The present invention can be described in more detail by referring to the following examples.

EXAMPLE 1

5.0 wt % of dimethyl [p-1-[2-diethylamino-2-{4-(β,β-dicyanovinyl)-3-methyl}methylamino]ethoxycarbonyl-2-hydroxymethylphenyl]silazane was added to 95 wt % of a mixed solvent of ethanol/acetone 20/80 to form an anti-reflective coating composition. Then, the coating composition was coated on a substrate by a conventional method. As a result, the photoresist did not lift off as did a substrate coated with HMD, and photoresist notching was lessened.

EXAMPLE 2

A coating composition was formed and the coating was performed according to the same method as described in Example 1 except that 5.0 wt % of polyvinylalcohol and 90 wt % of the mixed solvent were used instead of 95 wt % of the mixed solvent. This led to an effective decrease in notching by about 7.5% when compared with that in Example 1.

EXAMPLE 3

A coating composition was formed and the coating was performed according to the same method as described in Example 3 except that [4-[p-{4-(β,β-dicyanovinyl)-3-methyl}methylaminophenyl]-6-phenyl-1,3,5-triasinyl-2-aminobutyl]dimethylsilazane was used. This led to an improvement in adhesion and a reduction in notching.

EXAMPLE 4

A coating composition was formed and the coating was performed according to the same method as described in Example 3 except that 5.0 wt % of polyvinylalcohol and 90 wt % of the mixed solvent were used instead of 95 wt % of the mixed solvent. This led to an improvement in adhesion and a reduction in notching.

EXAMPLE 5

6.0 wt % of [4-{p-(o-ethylphenyl)hydrazylphenyl}-6-phenyl-1,3,5-triacynyl-2-aminobutyl]dimethylsilazane was added to 94 wt % of a mixed solvent of ethylcellosolve acetate/acetone 10/90 to form an anti-reflective coating composition. As a result, the photoresist was prevented from lifting off and notching was reduced.

EXAMPLE 6

A coating composition was formed and the coating was performed according to the same method as described in Example 5 except that 5.0 wt % of polysaccharide and 89 wt % of the mixed solvent were used instead of 94 wt % of the mixed solvent. As a result, the photoresist was prevented from lifting off and notching was reduced.

EXAMPLE 7

4.0 wt % of [[1-{4-(β,β-dicyanovinyl)-3-methyl}methylaminomethyl]-1'-(o-ethylphenyl)hydrazylmethyl]disiloxazane was added to 96 wt % of a mixed solvent of ethylcellosolve acetate/ethanol 15/85 to form an anti-reflective coating composition. As a result, the photoresist was prevented from lifting off and notching was reduced.

Comparative Example 1

As a result of coating HMDS on a substrate according to the same method as described in Example 1, it was found to be effective in preventing of a photoresist lifting off alone.

Comparative Example 2

6.7 wt % of polyamic acid, 5.3 wt % of curcumin, 1.0 wt % of polyvinyl pyrrolidone were added to 87 wt % of a mixed solvent of cyclohexanone/N-methyl-2-pyrrolidone 2/1 to form an anti-reflective coating composition. As a result, the sole effect was found in decreasing the occurrence of photoresist notching.

As described above, there is provided a composition having both a structure of organo-silicon compound exhibiting adhesion to a substrate and a photoresist and a structure of a dye compound having a high light absorption coefficient at a particular wavelength region in a single chemical molecule. Accordingly, the composition according to the present invention increases adhesion of the photoresist while preventing the notching of the photoresist.

The present invention is not limited to the above examples and many other variations will be readily apparent to those ordinarily skilled in this art.

What is claimed is:

1. An anti-reflective coating composition comprising 1.0–50.0 wt % of a dyed organosilicon compound having both a structure of organosilicon compound and a structure of a dye compound having light absorbing ability at a particular wavelength region, 50.0–99.0 wt % of solvent, and 0–10 wt % water-soluble polymer.

2. An anti-reflective coating composition according to claim 1, wherein said structure of organosilicon compound is derived from one compound selected from the group consisting of organosilane, organosilazane and organosiloxazane having chemical formulas of $R_4Si$, $R_3SiNH_2$ and $(H_2NSiR_2)_2O$, respectively, where "R" indicates a hydrogen, alkyl, aryl or alkoxy group.

3. An anti-reflective coating composition according to claim 2, wherein said organosilane structure is derived from trialkyl[p-1-(2-dialkylaminoalkoxycarbonyl-2-hydroxyalkyl)phenyl]silane or [4, 6-diphenyl-1,3,5-triasinyl-2-aminoalkyl]trialkylsilane, said organosilazane structure is derived from dedialkyl[p-(2-morpholinocarbonylalkyl) phenyl]silazane, and said organosiloxazane structure is derived from alkylsiloxazane or arylsiloxazane.

4. An anti-reflective coating composition according to claim 1, wherein said structure of the dye compound having light-absorbing capabilities at a particular wavelength region is derived from one selected from the group consisting of 1,1'-bianthracenylpolyene, 4-(β,β-dicyanovinyl)-3-alkyl-N,N-dialkylaniline, 4-tricyanovinyl-3-halo-N,N-dialkylaniline, alkylphenylazothioformic acid, coumarin derivatives, and thioacridone derivatives.

5. An anti-reflective coating composition according to claim 1, wherein the wavelength in which a dye compound maximally absorbs light is 300–500 nm.

6. An anti-reflective coating composition according to claim 1, wherein said solvent is one selected from the group consisting of alcohol, glycol ether, aromatic hydrocarbon, ketone, ester and a mixture thereof.

7. An anti-reflective coating composition according to claim 1, wherein said water-soluble polymer is one selected from the group consisting of cellulose, polysaccharide and polyalcohol.

* * * * *